(12) United States Patent
Vacanti

(10) Patent No.: US 10,613,198 B2
(45) Date of Patent: Apr. 7, 2020

(54) SYSTEM AND METHOD FOR TESTING INTEGRATED RADAR SYSTEMS

(71) Applicant: Honeywell International Inc., Morris Plains, NJ (US)

(72) Inventor: David C. Vacanti, Renton, WA (US)

(73) Assignee: Honeywell International Inc., Morris Plains, NJ (US)

( * ) Notice: Subject to any disclaimer, the term of this patent is extended or adjusted under 35 U.S.C. 154(b) by 309 days.

(21) Appl. No.: 15/495,363

(22) Filed: Apr. 24, 2017

(65) Prior Publication Data

US 2018/0306904 A1 Oct. 25, 2018

(51) Int. Cl.
*G01S 7/40* (2006.01)
*G01R 29/10* (2006.01)

(52) U.S. Cl.
CPC .......... *G01S 7/4056* (2013.01); *G01R 29/105* (2013.01); *G01S 2007/4086* (2013.01)

(58) Field of Classification Search
None
See application file for complete search history.

(56) References Cited

U.S. PATENT DOCUMENTS

| | | |
|---|---|---|
| 5,160,933 A | 11/1992 | Hager |
| 5,892,479 A | 4/1999 | Mills et al. |
| 6,114,985 A | 9/2000 | Russell et al. |
| 6,731,236 B1 | 5/2004 | Hager et al. |
| 7,161,527 B2 | 1/2007 | Vacanti |
| 7,239,266 B2 | 7/2007 | Vacanti |
| 7,295,151 B2 | 11/2007 | Vacanti |
| 7,705,773 B2 | 4/2010 | Vacanti |
| 7,825,851 B2 | 11/2010 | Vacanti |
| RE42,316 E | 5/2011 | Vacanti |
| 8,259,002 B2 | 9/2012 | Vacanti et al. |
| 8,791,856 B2 | 7/2014 | Vacanti et al. |
| 8,866,667 B2 | 10/2014 | Vacanti |
| 9,081,094 B2 | 7/2015 | Holt |
| 9,660,605 B2 | 5/2017 | Tinsley et al. |
| 9,678,197 B2 | 6/2017 | Vacanti |
| 10,018,716 B2 | 7/2018 | Ferguson et al. |
| 2009/0309783 A1 | 12/2009 | Shih et al. |

(Continued)

FOREIGN PATENT DOCUMENTS

GB 2100945 A 1/1983

OTHER PUBLICATIONS

Abdullah et al., "Design of Portable Mini Anechoic Chamber Using Low Cost Composite Absorber", Nov. 11-18, 2009, pp. 526-528, Publisher: Proceedings of 2009 IEEE Student Conference on Research and Development, Published in: UPM Serdang, Malaysia.

(Continued)

*Primary Examiner* — Whitney Moore
(74) *Attorney, Agent, or Firm* — Fogg & Powers LLC

(57) ABSTRACT

In one embodiment, a method is provided. The method comprises: transmitting, from a RADAR system, a frequency-modulated continuous wave (FMCW) RADAR signal in an anechoic chamber; receiving the FMCW RADAR signal at a test antenna in the anechoic chamber; generating a mixing signal; generating a simulated RADAR return signal from the mixing signal and the received FMCW RADAR signal; radiating the simulated RADAR return signal; and receiving the simulated RADAR return signal.

19 Claims, 4 Drawing Sheets

(56) References Cited

U.S. PATENT DOCUMENTS

| | | |
|---|---|---|
| 2014/0087668 A1* | 3/2014 | Mow .................... H04B 17/318 |
| | | 455/67.14 |
| 2014/0300509 A1 | 10/2014 | Choi |
| 2015/0084808 A1 | 3/2015 | Vacanti |
| 2015/0365064 A1 | 12/2015 | Tinsley et al. |
| 2015/0378017 A1 | 12/2015 | Ferguson et al. |
| 2017/0242118 A1 | 8/2017 | Vacanti |

OTHER PUBLICATIONS

Portune, "Garbage In—No Garbage Out Turn Hardware store purchases into a cavity filter for satellite and 2m reception.", Jul. 1996, pp. 12-14, Publisher: 73 Amateur Radio Today, Published in: Foster City, CA.

European Patent Office, "Extended European Search Report from EP Application No. 18168857.3 dated Sep. 19, 2018", from Foreign Counterpart to U.S. Appl. No. 15/495,363, Sep. 19, 2018, pp. 19, Published: EP.

Liao, "Challenges and Solutions of ADAS and Automotive Radar", Keysight Technologies, Dec. 2016, pp. 1-45, Keysight.

\* cited by examiner

SYSTEM AND METHOD FOR TESTING INTEGRATED RADAR SYSTEMS

BACKGROUND

Older frequency-modulated continuous wave (FMCW) range detection and ranging (RADAR) altimeters had a transceiver with RF input and output ports to be coupled to transmit and receive antennas. RADAR altimeters are used to determine range to, or altitude, above a surface, e.g. the ground. These ports allowed manufacturers and customers of the FMCW altimeters to couple test equipment, in lieu of the antennas, and evaluate the altimeters.

Modern FMCW altimeters are integrated incorporating the transceiver into a housing with one or more antennas. As a result, modern FMCW altimeter does not have such ports to facilitate connection of test equipment. Therefore, there is a need for another way to test integrated RADAR systems.

SUMMARY

In one embodiment, a method is provided. The method comprises: transmitting, from a RADAR system, a frequency-modulated continuous wave (FMCW) RADAR signal in an anechoic chamber; receiving the FMCW RADAR signal at a test antenna in the anechoic chamber; generating a mixing signal; generating a simulated RADAR return signal from the mixing signal and the received FMCW RADAR signal; radiating the simulated RADAR return signal; and receiving the simulated RADAR return signal.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding background and summary, or the following detailed description.

Figure 1A:
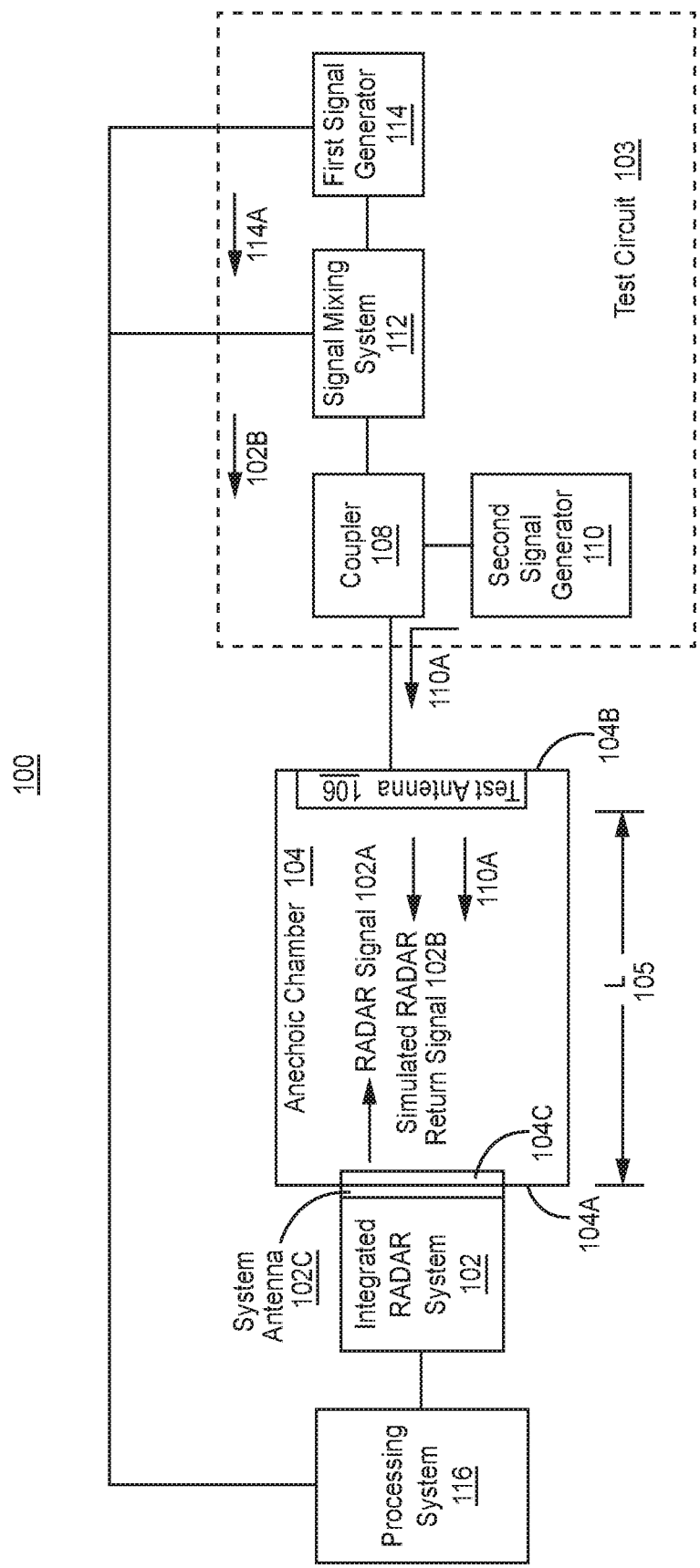
FIG. 1A illustrates one embodiment of a system for testing an integrated RADAR system.

FIG. 1A illustrates one embodiment of a system (test system) 100 for testing an integrated RADAR system 102. For purposes of clarity, although the integrated RADAR system 102 is illustrated in FIG. 1, it is not part of the test system 100. In another embodiment, the integrated RADAR system 102 may be referred to as the device under test (DUT).

An integrated RADAR system 102 is a RADAR system in which the RADAR transceiver and at least one system antenna 102C are incorporated into a housing. Signals emitted and received by the integrated RADAR system 102 are coupled to the environment through the at least one system antenna 102C. In one embodiment, the at least one antenna 102C comprises only one antenna, e.g. for both transmitting and receiving. In another embodiment, the at least one antenna 102C comprises two antennas, e.g. one for transmitting and one for receiving. In a further embodiment, the at least one antenna 102C comprises a plurality of antenna elements, e.g. forming a phased array antenna.

In one embodiment, the housing can be formed from sub-housings that are combined. In another embodiment, an integrated RADAR system 102 can be an FMCW RADAR (e.g. for use as a RADAR altimeter), a phased array FMCW RADAR, or any other type of FMCW RADAR having the RADAR transceiver and at least one antenna that are integrated into a housing.

The test system 100 includes an anechoic chamber 104, a test circuit 103, and a processing system 116. The anechoic chamber 104 is coupled to the test circuit 103 and is configured to be coupled to the integrated RADAR system 102. In one embodiment, the processing system 116 is coupled to the test circuit 103.

The anechoic chamber 104 includes a first side (first end) 104A and a second side (second end) 104B. A first side 104A of the anechoic chamber 104 is configured to be attached to the integrated RADAR system 102. In one embodiment, the at least one system antenna 102C of the integrated RADAR system 102 is coupled to an opening 104C in the first side 104A of the anechoic chamber 104.

The anechoic chamber 104 includes the test antenna 106 inside the anechoic chamber 104. The test antenna 106, configured to operate on the band of the integrated RADAR system 102, is installed on the second side 104B of the anechoic chamber 104 opposite the first side 104A to which the integrated RADAR system 102 is attached.

The integrated RADAR system 102 emits a RADAR signal 102A towards the test antenna 106. The test antenna 106 emits, or radiates, a simulated RADAR return signal 102B towards the integrated RADAR system 102. In one embodiment, the RADAR signal 102A is a frequency-modulated (FM) signal; in this embodiment, the simulated RADAR return signal 102B is also a FM signal. In another embodiment, the RADAR signal is a FMCW signal with a saw-tooth or triangular waveform in the time domain; in this embodiment, the simulated RADAR return signal 102B is also a FMCW signal with respectively a saw-tooth or triangular waveform in the time domain.

The simulated RADAR return signal 102B mimics a portion of the RADAR signal 102A, e.g. which is frequency-modulated, reflected from an object at a distance from the RADAR system 102. As will be further described, the simulated RADAR return signal 102B is frequency-offset from the frequency-modulated RADAR signal. In one embodiment, the simulated RADAR return signal 102 has a frequency equal to a difference of a frequency of the RADAR signal 102A and an offset frequency (or frequency of the mixing signal 114A).

In one embodiment, the anechoic chamber 104 is compact to limit the effect signal delay and loss between the integrated RADAR system 102 and the test antenna 106. As a result, the signal loss is de minis. The anechoic chamber 104 also:

(a) diminishes or eliminates signal reflections of the RADAR signal 102A and any other signals conveyed in the anechoic chamber 104; and (b) shields the integrated RADAR system 102 and test antenna 106 from undesired signals present in the environment.

In one embodiment, the anechoic chamber 104 is relatively small where the distance L 105 from the integrated RADAR system 102 (at one end of the anechoic chamber 104) to the test antenna 106 (at the other end of the anechoic chamber 104) is about twenty-four to thirty inches. In another embodiment, the distance L 105 between the integrated RADAR system 102 and the test antenna 106 is less than the minimum resolution range of the RADAR system 106. Other than for the embodiment where L 105 is less than the minimum resolution range of the RADAR system 106, the exact dimensions of the anechoic chamber 104 are not critical. In a further embodiment, to diminish reflections, the second end 104B of the anechoic chamber 104 proximate to the test antenna 106 has is tapered towards the test antenna 106, e.g. having a cone shape. Because of their compact size, the anechoic chamber 104 coupled, or attached, to the RADAR system 102 may be readily inserted into environmental testers, e.g. to test the effect of temperature, humidity, vibration and/or radiation levels on the performance of the RADAR system 102.

In one embodiment, the test antenna 106 has an effective aperture (aperture) approximately equal to or less than the effective aperture of the system antenna 102C of the integrated RADAR system 102. In another embodiment, the test antenna 106 is has low reflectivity, e.g. a low RADAR cross section, and is for example a dipole.

The test antenna 106, through a second side 104B of the anechoic chamber 104, is coupled to the test circuit 103. Thus, the RADAR signal 102A is coupled from the test antenna 106 to the test circuit 103.

In one embodiment, the test circuit 103 includes a signal mixing system 112 coupled to a first signal generator 114. In another embodiment, processing system 116 is coupled to the signal mixing system 112 and/or first signal generator 114.

The signal mixing system 112 is coupled to a first signal generator 114. In one embodiment, the first signal generator 114 is a programmable sinusoidal frequency generator or a programmable arbitrary wave form generator. In another embodiment, the first signal generator 114 generates a mixing signal 114A, or first frequency offset component, coupled to the signal mixing system 112. In a further embodiment, the mixing signal 114A is a sinusoidal waveform, which when mixed in the signal mixing system 112 with the RADAR signal 102A generate mixing products that include the simulated RADAR return signal 112 which is a desired mixing product corresponding to a simulated RADAR return signal 102B of a predetermined range.

The frequency of the sinusoidal waveform of the mixing signal 114A corresponds to the predetermined range. Range is linearly related to the frequency of the sinusoidal waveform of the mixing signal 114A. Frequency=Range Delay*Modulation Rate, where Range Delay=2*Distance/Speed of light, the factor of 2 is due to the round trip time to and from the target, and Modulation Rate=FMCW chirp bandwidth/period of the FMCW chirp waveform. All units must be consistent, e.g. meters, Hertz and seconds.

In one embodiment, the frequency of the sinusoidal mixing signal is fixed, thus corresponding to a fixed range. In another embodiment, the frequency of the sinusoidal mixing signal varies, e.g. to generate a RADAR return signal simulating varying range which can represent varying terrain and/or structure(s). Thus, even though the distance L 105 is relatively short, the simulated RADAR return signal 102B can represent a range, varying or constant, that is much greater than the distance L 105 within the anechoic chamber 104.

Figure 1B:
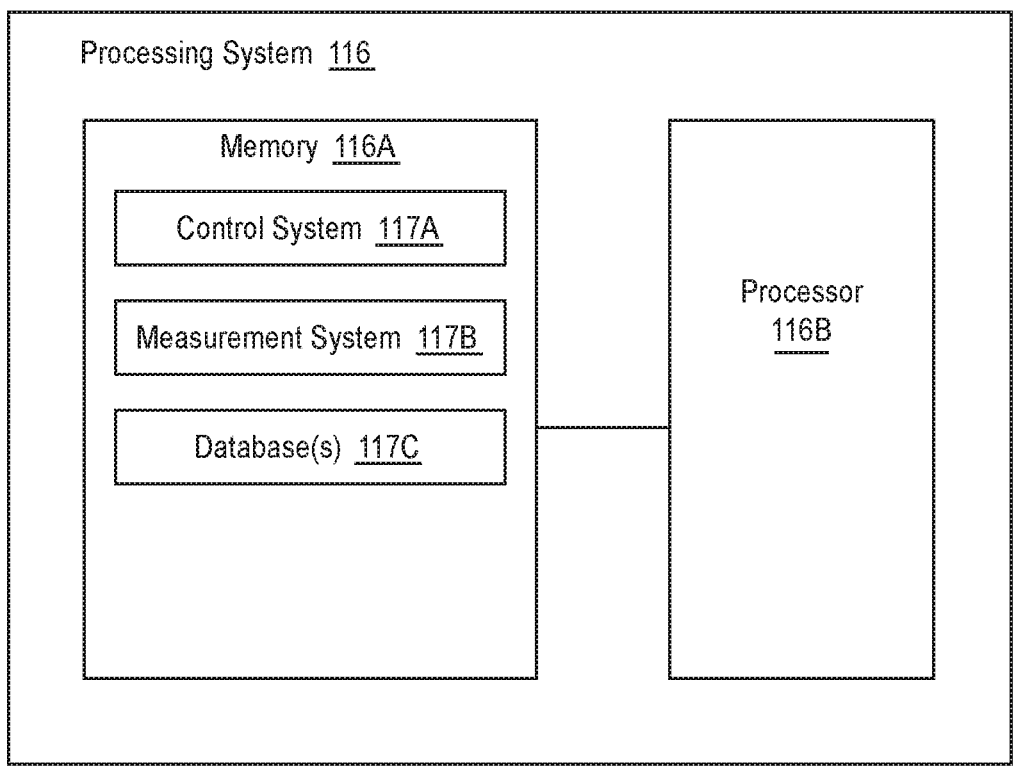
FIG. 1B illustrates one embodiment of a processing system.

FIG. 1B illustrates one embodiment of a processing system 116. The processing system comprises a memory 116A coupled to a processor 116B. In another embodiment, the memory 116A and processor 116B may be implemented in whole or in part by a state machine or field programmable gate array. In a further embodiment, the processing system 116 is a personal computer.

In one embodiment, the memory 116A comprises a control system 117, a measurement system 117B and at least one database 117C. In another embodiment, the control system 117 is used to control the integrated RADAR system and components of the test system 100. In a further embodiment, the measurement system 117B is used to record and analyze measurements of the integrated RADAR system 102, e.g. of data representative of the simulated range detected by the integrated RADAR system 102. In yet another embodiment, the control system 117, the measurement system 117B and the at least one database 117C are software executed by or processed by the processor 116B. In yet a further embodiment, the at least one database stores the measurements, e.g. of data representative of the simulated range detected by the integrated RADAR system 102, calibration settings, range profiles, and/or a table or equation corresponding to the desired simulated range and the frequency of the first signal generator 114. The at least one database includes any means of storing data, including but not limited to conventional database(s), data file(s), and data register(s).

In one embodiment, all or part of the processing system 116 is located proximate to the test system 100; the part of the processing system 116 not located proximate to the test system 100 is located remotely from the test system 100. In another embodiment, the processing system is a computer such as a personal computer. In a further embodiment, all of the processing system may be located remotely. In yet another embodiment, all or a portion of the processing system 100 that is located remotely is located in a cloud computing system or a server system.

The processing system 116 is coupled to the first signal generator 114 and controls the frequency of the sinusoidal waveform, and hence the simulated RADAR return signal 102B. The processing system 16 is also configured to be coupled to the integrated RADAR system 102, e.g. to activate the integrated RADAR system 102, control the integrated RADAR system 102, and record and analyze the data generated by the integrated RADAR system 102. Data generated by the integrated RADAR system 102 includes data representative of the simulated range of the simulated RADAR return signal 102B.

In one embodiment, the test circuit 103 includes a coupler 108. In another embodiment, the anechoic chamber 104 (e.g. the test antenna 106) is coupled to the signal mixing system 112 through a coupler 108. In a further embodiment, the coupler 108 is a directional coupler.

At least one second signal generator 110 is also coupled to the coupler 108. In one embodiment, the at least one second signal generator 110 generates at least on simulated interference signal 110A. In another embodiment, the at least one second signal generator 110 is one or more other radar systems which emulate interfering radar signals. In a further embodiment, the amplitude of the signals generated by the one or more other radar system may be attenuated by one or more attenuators.

Figure 2A:
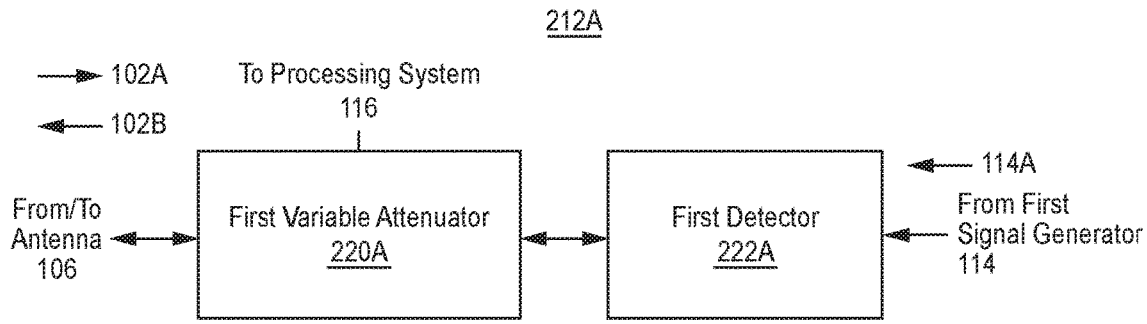
FIG. 2A illustrates one embodiment of a signal mixing system.

FIG. 2A illustrates one embodiment of the signal mixing system 212A. The signal mixing system 212A comprises a first variable attenuator 220A coupled to a first detector 222A. In another embodiment, the first detector 222A is a non-linear device such as diode or crystal detector. The first variable attenuator 220A is coupled to the test antenna 106. In a further embodiment, the first variable attenuator 220A is coupled to the test antenna 106 through the coupler 108. In yet another embodiment, the first variable attenuator 220A is coupled to the processing system 116 and is configured to be programmed by the processing system 116. The attenuation level of the first variable attenuator 220A can be varied, e.g. by the processing system 116, to diminish the amplitude of the simulated RADAR return signal 102B. By varying the amplitude of the simulated RADAR return signal 102B, the test system 100 can be used to determine the dynamic range including the sensitivity of the integrated RADAR system 102.

In this embodiment, the RADAR signal 102A will be attenuated by a first variable attenuator 220A as it propagates from the test antenna 106 to the first detector 222A. The simulated RADAR return signal 102B will also be attenuated by the first variable attenuator 220A as it propagates away from the first detector 222A to the test antenna 106. In another embodiment, the processing system 116, e.g. with the control system 117A, measurement system 117B and/or calibration settings stored in the at least one database 117C, compensates for both attenuation paths when determining the attenuation level of the first variable attenuator 220A. In a further embodiment, the processing system 116, e.g. with the control system 117A, measurement system 117B and/or calibration settings stored in the at least one database 117C, also accounts for the conversion efficiency of the first detector 222A.

The first detector 222A generates mixing products at the sum and difference of the frequencies of the RADAR signal 102A and the mixing signal 114A. In one embodiment, the frequency of the simulated RADAR return signal 102B is a difference frequency: $f_{RS}-f_{MS}$, where $f_{RS}$ is a frequency of the RADAR signal 102A and $f_{MS}$ is a frequency of the mixing signal 114A. The integrated RADAR system 102 converts the difference frequency of the difference product into data, corresponding to range. In another embodiment, the integrated RADAR system 102 generates the range by performing a discrete Fourier transform (DFT), such as a fast Fourier transform (FFT), on signals received by the integrated RADAR system 102. Each DFT bin, or frequency, corresponds to a range by multiplying the range resolution per DFT bin by the DFT bin number. The range resolution per bin is the speed of light/(2*chirp bandwidth). In a further embodiment, the processing system 116 stores the such data corresponding to range, the corresponding frequency of the first signal generator 114, and/or the attenuation level of the first variable attenuator 220A, e.g. in the at least one database 117C.

Figure 2B:
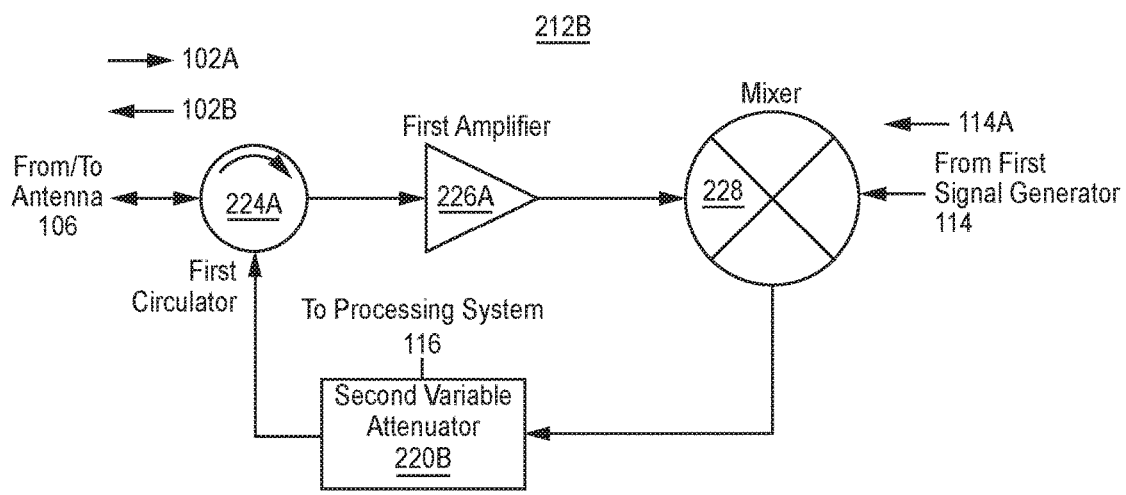
FIG. 2B illustrates another embodiment of a signal mixing system.

FIG. 2B illustrates another embodiment of the signal mixing system 212B. This signal mixing system 212B has a higher dynamic range then the embodiment of the signal mixing system 212A of FIG. 2A. The signal mixing system 212B includes a first circulator 224A, a first amplifier 226A, a mixer 228, and a second variable attenuator 220B. The first circulator 224A has a first port, a second port, and a third port. The second port of the first circulator 224A is coupled respectively to the input of a first amplifier 226A. In another embodiment, the first amplifier 226A is a power amplifier. The output of the first amplifier 226A is coupled to the local oscillator (LO) input port of the mixer 228. In a further embodiment, the mixer 228 is a double balanced mixer. The second variable attenuator 220B is coupled to the radio frequency (RF) output port of the mixer 228 and the third port of the first circulator 224A. In yet another embodiment, the second variable attenuator 220B is coupled to the processing system 116 and is configured to be programmed by the processing system 116. The first port of the first circulator 224A is configured to be coupled to the test antenna 106. The intermediate frequency (IF) port of the mixer 228 is configured to be coupled to the first signal generator 114. However, in other embodiments, different ports of the mixer 228 are configured to be coupled to the first amplifier 226A, second variable attenuator 220B, and first signal generator 114. In yet a further embodiment, the processing system 116 stores and accounts for, e.g. in the control system 117A, measurement system 117B, and/or at least one database 117C, the insertion loss, gain, and conversion efficiency of respectively the first circulator 224B, first amplifier 226B, and the mixer 228.

For this embodiment of the signal mixing system 212B, the RADAR signal 102A passes through the first circulator 224B to the first amplifier 226B, and is amplified by the first amplifier 226B, is mixed with the mixing signal 114A. The desired mixing product, generated as described above, is coupled to the first circulator 224B through the second variable attenuator 220B. Thus, the test antenna 106 is configured to receive the simulated RADAR return signal 102B from the second variable attenuator 220B.

Figure 2C:
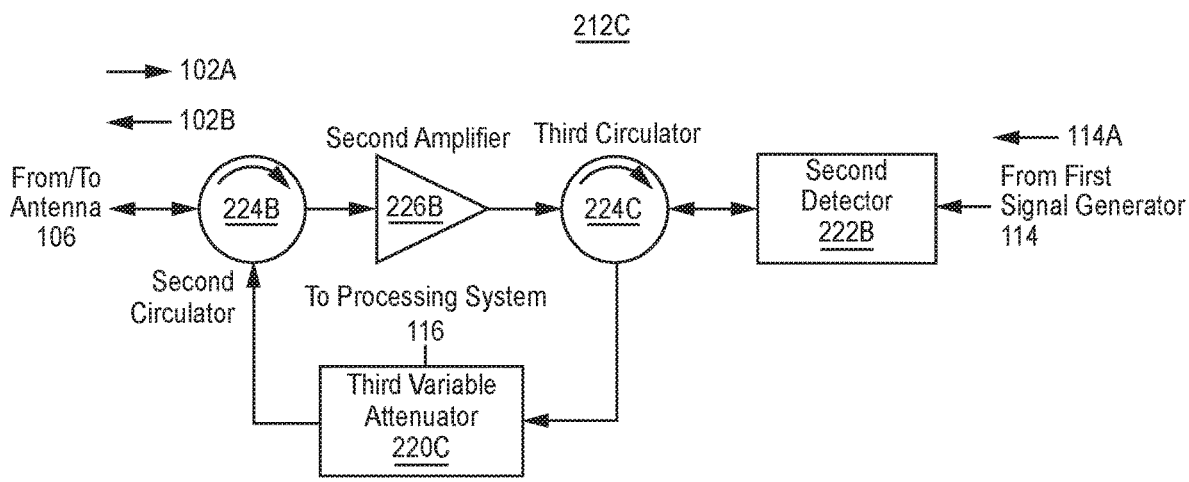
FIG. 2C illustrates yet another embodiment of a signal mixing system.

FIG. 2C illustrates yet another embodiment of the signal mixing system 212C. This signal mixing system 212C also has a higher dynamic range then the embodiment of the signal mixing system 212A of FIG. 2A. The signal mixing system 212C includes a second circulator 224B, a second amplifier 226B, a third circulator 224C, a second detector 222B, and a third variable attenuator 220C. The second circulator 224B and third circulator 224C each have a first port, a second port, and a third port. The second port of the second circulator 224B is coupled respectively to the input of the second amplifier 226B. In another embodiment, the second amplifier 226C is a power amplifier. The output of the second amplifier 226B is coupled to the first port of the third circulator 224C. The second port of the third circulator 224C is coupled to a second detector 222B. In a further embodiment, the second detector 222B is a non-linear device such as diode or crystal detector. The third variable attenuator 220C is coupled to the third port of the second circulator 224B and the third port of the third circulator 224C. In yet another embodiment, the third variable attenuator 220C is coupled to the processing system 116 and is configured to be programmed by the processing system 116. The first port of the second circulator 224B is configured to be coupled to the test antenna 106. In yet another embodiment, the processing system 116 accounts for and stores, e.g. in the control system 117A, measurement system 117B, and/or at least one database 117C, the insertion loss, gain, insertion loss, and conversion efficiency of respectively the second circulator 224B, second amplifier 226B, third circulator 224C and the second detector 222B.

Figure 3:
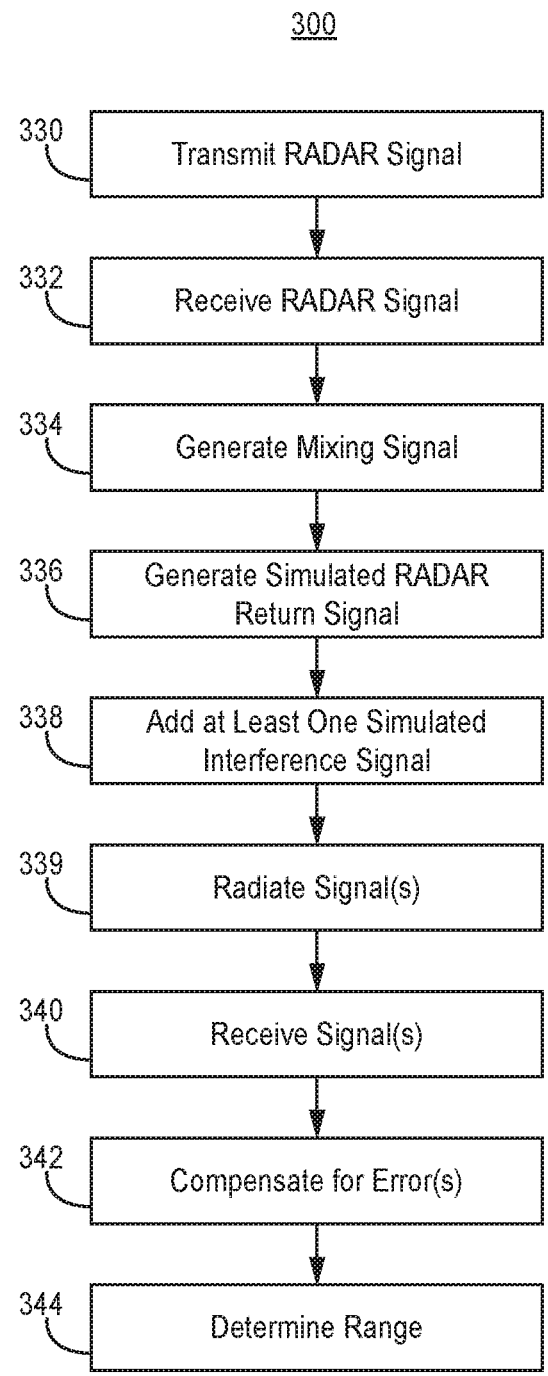
FIG. 3 illustrates one embodiment of a method for testing a RADAR system.

FIG. 3 illustrates one embodiment of a method 300 for testing an integrated RADAR system 102. To the extent that the embodiment of method 300 shown in FIG. 3 is described herein as being implemented in the systems shown in FIGS. 1 through 2C, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figure) can occur in a different order (for example, where at least some of the processing associated with the blocks is performed in parallel and/or in an event-driven manner).

In block 330, transmit a RADAR signal, e.g. from the integrated RADAR system 102. In one embodiment, the RADAR signal is a triangle wave or saw tooth wave FMCW signal modulated on a carrier frequency, e.g. in a microwave band.

In block 332, receive the transmitted RADAR signal e.g. at the test antenna 106. In block 334, generate a mixing signal 114A, e.g. from the first signal generator 114. In one embodiment, the mixing signal 114A is sinusoidal waveform having a fixed or varying frequency.

In block 336, generate a simulated RADAR return signal, e.g. by mixing the mixing signal 114A with the RADAR signal 102A. In one embodiment, the mixing signal 114A has a fixed or varying frequency to model returns from fixed range or varying range. In another embodiment, the frequency of the mixing signal 114A, e.g. generated by the first signal generator 114, is used to create a simulated RADAR return signal 102B having a fixed or varying range. In a further embodiment, the frequency of the mixing signal can be varied to determine the maximum tracking rate of the RADAR system 102, e.g. which is a RADAR altimeter.

In one embodiment, a detector or mixer in the signal mixing system 112 generates the simulated RADAR return signal 102B. In another embodiment, in block 338, attenuate the simulated RADAR return signal 102B to generate a fixed or varying level of amplitudes of the simulated RADAR return signal 102B. In a further embodiment, the level of attenuation of the simulated RADAR return signal 102B is controlled by the processing system 116 which e.g. controls the attenuation level of the variable attenuator in the signal mixing system 112.

In one embodiment, in block 338, add at least one simulated interference signal 110A, e.g. at least one simulated interfering RADAR signal. In another embodiment, the at least one simulated interference signal 110A is generated from the at least one second signal generator 110.

In one embodiment, in block 339, radiate, e.g. from the test antenna 106, the simulated RADAR return signal, attenuated or not. In another embodiment, radiate, e.g. from the test antenna 106, at least one simulated interference signal.

In block 340, receive the simulated RADAR return signal, attenuated or not, e.g. at the integrated RADAR system 102 from the test antenna 106. In one embodiment, receive the at least one simulated interference signal, e.g. at the integrated RADAR system 102 from the test antenna 106.

In block 342, compensate for at least one error, e.g. in the test system 100. In one embodiment, compensate for the error $f_{DELAY}$ in the simulated range measured, e.g. measured by the integrated RADAR system 102. The error $f_{DELAY}$ is caused by round trip propagation delay in the test system 100, e.g. round trip through the length of the anechoic chamber 104, the coupler 108 if used, and any transmission line(s) (e.g. coaxial cable(s) and/or waveguide(s)) coupling the test antenna 106, coupler 108 (if used), and the signal mixing system 112. This round trip propagation delay, e.g. of the test circuit, can create an error component that affects the distance measurement accuracy, and must be characterized and compensated for, e.g. in the processing system 116, for example using the measurement system 117B and/or the at least one database 117C. The delay can be determined by subtracting the $f_{RS}-f_{MS}+f_{DELAY}$ from $f_{RS}+f_{MS}+f_{DELAY}$ and dividing by two.

In one embodiment, in block 344, determine range. In another embodiment, determine raw range or uncompensated range prior to or without compensating for errors. In a further embodiment, determine compensated range, e.g. compensating for one or more errors.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A test system for testing a RADAR system that is configured, via a system antenna having an aperture, to transmit a frequency-modulated RADAR signal and receive a frequency-modulated simulated RADAR return signal, the test system comprising:
   an anechoic chamber having a first end configured to receive the system antenna and having a second end;
   a test antenna disposed at the second end of the anechoic chamber and configured to have an aperture that is approximately the same as, or smaller than, the aperture of the system antenna;
   test circuitry coupled to the test antenna and configured to generate, and to transmit via the test antenna, the frequency-modulated simulated RADAR return signal that mimics a portion of the frequency-modulated RADAR signal reflected from an object at a predetermined distance from the RADAR system; and
   wherein a distance between the first end of the anechoic chamber and the test antenna is less than the minimum resolution of the RADAR system.

2. The test system of claim 1, wherein the test circuitry is configured to receive the frequency-modulated RADAR signal via the test antenna, and generate the frequency-modulated simulated RADAR return signal that is frequency-offset from the frequency-modulated RADAR signal;
   wherein the frequency-modulated simulated RADAR return signal has a frequency equal to a difference of a frequency of the frequency-modulated RADAR signal and a first offset frequency component; and
   wherein the frequency-modulated simulated RADAR return signal is radiated via the test antenna.

3. The test system of claim 1, wherein the single test circuitry is configured to vary an amplitude of the frequency-modulated simulated RADAR return signal.

4. The test system of claim 1, wherein the second end of the anechoic chamber is tapered towards the test antenna to reduce reflections of the frequency-modulated RADAR signal.

5. The test system of claim 4, wherein the second end of the anechoic chamber is cone shaped to reduce reflections of the frequency-modulated RADAR signal.

6. A test system for testing a RADAR system, comprising:
an anechoic chamber, comprising:
  a first end configured to be coupled to the RADAR system;
  a second end; and
  a test antenna mounted proximate to the second end;
a signal mixing circuit coupled to the test antenna;
a first signal generator coupled to the signal mixing circuit;
wherein the first signal generator is configured to generate a sinusoidal waveform having a fixed or varying frequency;
processing circuitry coupled to the first signal generator, and configured to be coupled to the RADAR system;
wherein the signal mixing circuit is configured to generate mixing products that include a desired mixing product that is a simulated RADAR return signal of a predetermined range; and
wherein a distance between the test antenna and the RADAR system is less than a minimum resolution range of the RADAR system.

7. The test system of claim 6, wherein the signal mixing circuit is coupled to the processing circuitry.

8. The test system of claim 6, wherein the signal mixing circuit comprises a detector, and a variable attenuator coupled to the detector; and
  wherein the detector generates the simulated RADAR return signal.

9. The test system of claim 6, further comprising a coupler coupled to the test antenna and the signal mixing circuit; and
  at least one second signal generator coupled to the coupler.

10. The test system of claim 6, wherein the processing circuitry comprises:
  a processor;
  a memory coupled to the processor; and
  wherein the memory includes a control system, a measurement system and at least one database.

11. The test system of claim 6, wherein the processing circuitry is configured to compensate for error caused by a round-trip signal delay.

12. The test system of claim 6, wherein the second end of the anechoic chamber is tapered towards the test antenna to reduce reflections of a RADAR signal.

13. The test system of claim 12, wherein the second end of the anechoic chamber is cone shaped to reduce reflections of the RADAR signal.

14. A method, comprising:
  transmitting, from a RADAR system, a frequency-modulated continuous wave (FMCW) RADAR signal in an anechoic chamber, where a distance between a test antenna and the RADAR system is less than a minimum resolution range of the RADAR system;
  receiving the FMCW RADAR signal at a test antenna in the anechoic chamber;
  generating a mixing signal comprising mixing products that include a desired mixing product that is a simulated RADAR return signal of a predetermined range;
  generating the simulated RADAR return signal from the mixing signal and the received FMCW RADAR signal;
  radiating only the simulated RADAR return signal; and
  receiving the simulated RADAR return signal at the RADAR system.

15. The method of claim 14, further comprising determining range.

16. The method of claim 14, further comprising compensating for errors.

17. The method of claim 14, wherein generating a mixing signal comprises generating a mixing signal that is a sinusoidal waveform having a constant frequency or a varying frequency.

18. The method of claim 14, further comprising:
  adding at least one simulated interference signal; and
  radiating the at least one simulated interference signal.

19. The method of claim 14, further comprising attenuating the simulated RADAR return signal.

* * * * *